(12) United States Patent
Himmelstoss et al.

(10) Patent No.: US 8,212,715 B2
(45) Date of Patent: Jul. 3, 2012

(54) MODULAR RADAR SYSTEM

(75) Inventors: Armin Himmelstoss, Weissach Im Tal (DE); Joachim Hauk, Renningen-Malmsheim (DE); Elisabeth Hauk, legal representative, Renningen-Malmsheim (DE); Rahel Hauk, legal representative, Renningen-Malmsheim (DE); Manuel Hauk, legal representative, Renningen-Malmsheim (DE); Dirk Steinbuch, Wimsheim (DE)

(73) Assignee: Robert Bosch GmbH, Stuttgart (DE)

( * ) Notice: Subject to any disclaimer, the term of this patent is extended or adjusted under 35 U.S.C. 154(b) by 300 days.

(21) Appl. No.: 12/629,252

(22) Filed: Dec. 2, 2009

(65) Prior Publication Data

US 2010/0171648 A1   Jul. 8, 2010

(30) Foreign Application Priority Data

Dec. 4, 2008   (DE) .......................... 10 2008 044 355

(51) Int. Cl.
*G01S 7/28*   (2006.01)
(52) U.S. Cl. ......... 342/103; 342/127; 342/134; 342/135
(58) Field of Classification Search .................. 342/103, 342/127, 134, 135
See application file for complete search history.

(56) References Cited

U.S. PATENT DOCUMENTS

| | | | | |
|---|---|---|---|---|
| 3,530,467 A | * | 9/1970 | Attwood et al. | 342/102 |
| 4,118,701 A | * | 10/1978 | Fletcher et al. | 342/200 |
| 4,804,961 A | * | 2/1989 | Hane | 342/125 |
| 4,833,480 A | * | 5/1989 | Palmer et al. | 342/125 |
| 5,239,309 A | * | 8/1993 | Tang et al. | 342/13 |
| 5,400,034 A | * | 3/1995 | Smith | 342/103 |
| 7,737,880 B2 | * | 6/2010 | Vacanti | 342/70 |
| 7,812,760 B2 | * | 10/2010 | Teshirogi et al. | 342/135 |
| 7,982,661 B2 | * | 7/2011 | Beasley | 342/128 |
| 2006/0197699 A1 | | 9/2006 | Cornic | |
| 2010/0171648 A1 | * | 7/2010 | Himmelstoss et al. | 342/103 |

FOREIGN PATENT DOCUMENTS

| | | |
|---|---|---|
| DE | 10163653 | 1/1958 |
| DE | 19632889 A1 * | 2/1998 |
| DE | 102005049772 | 6/2006 |
| DE | 102004059333 | 4/2007 |
| EP | 1600793 A2 * | 11/2005 |
| GB | 2 356 989 | 6/2001 |
| WO | WO 03027708 A1 * | 4/2003 |
| WO | WO 2007/052247 | 5/2007 |

OTHER PUBLICATIONS

D'Addario, Larry, "ALMA Project Book, Chapter 7, Local Oscillators", Jan. 12, 2002, XP007912074. 59 pages.
Kühn, Mark R., "Subharmonische Injektionssynchronisation aktiver Antennenarrays", Apr. 23, 2004, XP007912075, 110 pages, English abstract provided.

\* cited by examiner

*Primary Examiner* — John B Sotomayor
(74) *Attorney, Agent, or Firm* — Kenyon & Kenyon LLP

(57) ABSTRACT

A radar system includes at least two modules, each having a phase detector and a first high-frequency source and each having an antenna output and/or each having one or more antennas. At least two modules include a device for synchronization between the first high-frequency source of a first module of the at least two modules and the first high-frequency source of a second module of the at least two modules of the radar system. The phase detector has a first input for a first reference signal. The phase detector also has a second input for a first loop signal. A module for a radar system has the design of one of the modules of the radar system described above.

12 Claims, 4 Drawing Sheets

MODULAR RADAR SYSTEM

FIELD OF THE INVENTION

The present invention relates to a radar system including at least two modules, each having a phase detector, a first high-frequency source and an antenna output and/or each having one or more antennas. At least two modules include a device for synchronization between the first high-frequency source of a first of the at least two modules and the first high-frequency source of a second of the at least two modules of the radar system. The phase detector has a first input for a first reference signal. Furthermore, the present invention relates to a module for a radar system.

BACKGROUND INFORMATION

Radar transmitters of radar sensors are operated using a high-frequency source (an oscillator). The high-frequency source operates either directly on the frequency emitted in a regulating loop or operates at a lower frequency which is multiplied to the frequency to be transmitted. The two following techniques are known for distribution of the transmission power for long-range radar (LRR), medium-range radar (MRR) and short-range radar (SRR). A single-beam radar having electromechanical beam slewing equipment and/or a passive distribution network may be used. In the latter case, amplifiers may additionally be provided to compensate for distribution losses.

PCT International Patent Publication No. WO 2007/052247 describes a radar system for automatic driving by providing a multiplex for distributing a reference signal among four transceiver units. Each transceiver unit includes four antenna outputs for one antenna each of a phased-array antenna field. Each antenna is supplied with transmission power by a separate phase-scanned injection-locked push-push oscillator (PS-IPPO). The phase of each of the PS-IPPOs is synchronized in the pull range by a cascade of upstream PS-IPPOs with a reference signal from a reference signal generator. Outside of its pull range, the respective PS-IPPO is a free-wheeling oscillator. Injection-locked oscillators have the disadvantage that it is difficult to influence a time characteristic of the tracking of the oscillator.

SUMMARY OF THE INVENTION

One object of the present invention is to provide a generic modular radar system that will facilitate the influencing of the time characteristic in tracking of the oscillator. In addition, an object of the present invention is to provide a module for a radar system having this advantage. This object is achieved according to the present invention.

The present invention is based on the generic radar system in that the phase detector has a second input for a first loop signal, in particular for a first loop signal of a phase-locked loop (PLL). In particular, a frequency-rigid and/or phase-rigid coupling of the oscillators may be accomplished in this way. The antenna systems used for the radar system according to the present invention may also have an invariable or at least not continuously variable detection angle or detection direction. The types of modulation used in the generic radar systems are usually FM-based, such as FMCW, stepped FM, stepped CW, multiplex FM or multifrequency modulation (FM=frequency modulation; FMCW=frequency-modulated continuous wave).

According to a preferred specific embodiment, the module has a second high-frequency source and a mixer, which in turn has a first input for a second loop signal of the phase-locked loop, an output of the second high-frequency source being connected to a second input of the mixer.

In one advantageous specific embodiment, the second high-frequency source has an input for a second reference signal.

According to another preferred specific embodiment, each module has a bus terminal for controlling the module or a charge pump and/or a filter and/or a first frequency divider and/or a frequency multiplier and/or a high-frequency power amplifier.

According to a preferred further embodiment, the module has a device for providing a synchronization signal for one of the following modules.

The device for providing the synchronization signal may preferably include a second frequency divider.

It is advantageous if each module has a reception converter.

It is also preferred in particular if the individual modules of the radar system are activatable and/or deactivatable in a targeted manner.

According to a further specific embodiment, the modules of the radar system have an identical design.

Furthermore, the present invention is based on a generic module for a radar system in that the module has the design of one of the modules of one of the specific embodiments of the radar system described above.

DETAILED DESCRIPTION

Figure 1:
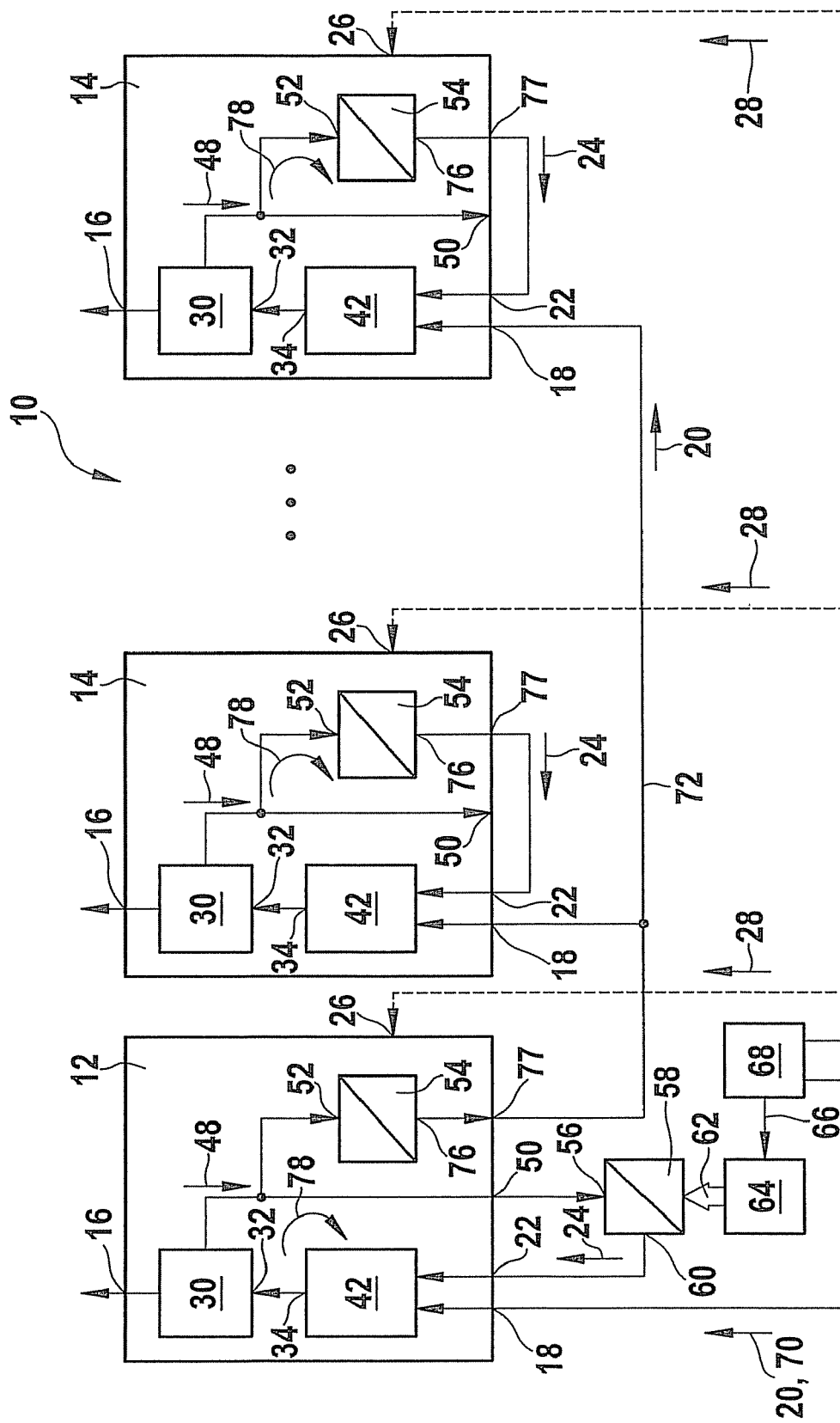
FIG. 1 shows a schematic block diagram of a first specific embodiment of the radar system according to the present invention.
Figure 2:
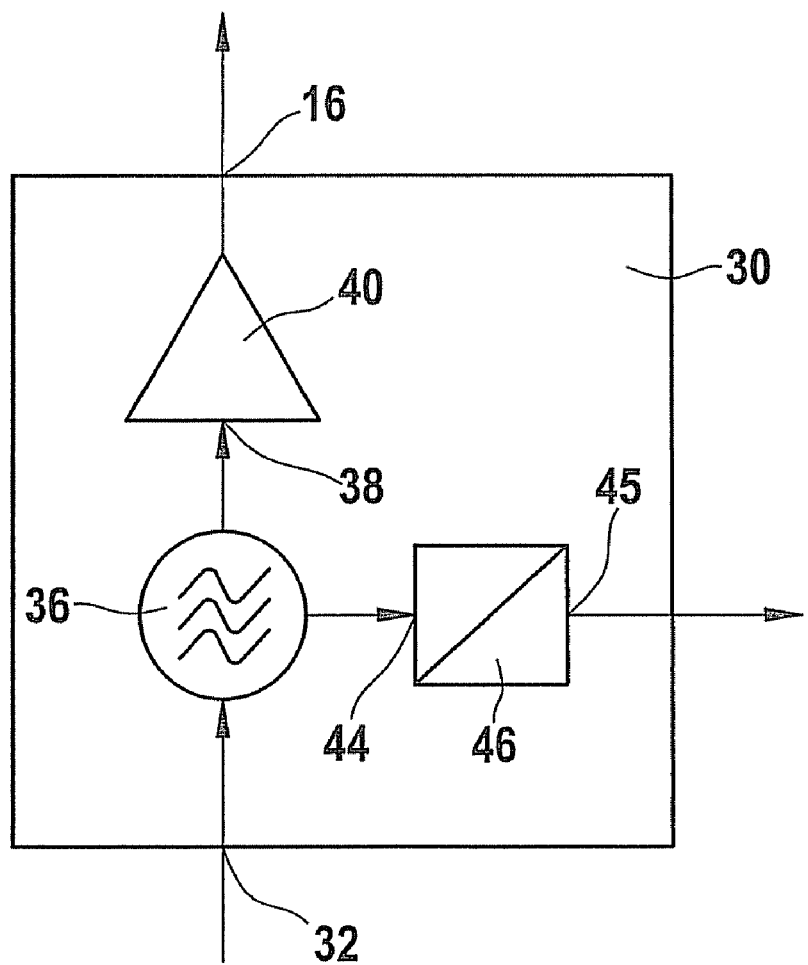
FIG. 2 shows a schematic block diagram of a first high-frequency source of the first, second or third specific embodiment of the radar system according to the present invention.

FIG. 1 shows a schematic block diagram of a first specific embodiment of radar system 10 according to the present invention. Radar system 10 includes a plurality of identically designed modules 12, 14 (radar system modules; high-frequency modules). Each module 12, 14 has an output terminal 16 for a transmission antenna and has an input terminal 18 for a reference signal 20 and an input terminal 22 for a first loop signal 24. An input 26 is optionally also provided for each central clock signal 28. Each module 12, 14 includes a first high-frequency source 30, whose schematic block diagram is shown in FIG. 2. First high-frequency source 30 includes a voltage-controlled high-frequency oscillator 36 (VCO), which has an input 32 for predetermining the frequency to be generated and supplies a high-frequency voltage to input 38 of an output amplifier 40. Input 32 of first high-frequency source 30 for predetermining the frequency to be generated is connected to an output 34 of a frequency-control component 42 which is known to those skilled in the art and which includes a phase detector, a charge pump and a filter. Output amplifier 40 outputs the amplified high-frequency transmission signal to antenna output 16. Furthermore, high-frequency oscillator 36 or output amplifier 40 relays the high-frequency signal to an input 44 of a first frequency divider 46.

An output 45 of first frequency divider 46 supplies a second loop signal 48, which is sent to a loop output 50 of module 12, 14 and to an input 52 of a second frequency divider 54. Loop output 50 of master module 12 is connected to a loop input 56 of a third frequency divider 58. A first output 60 of third frequency divider 58 is connected to loop input 22 of master module 12. Loop input 22 of each module 12, 14 is connected to a loop input of frequency control component 42 of particular module 12, 14. A division ratio of third frequency divider 58 is adjustable via a microcontroller 64 or via a programmable integrated circuit 64 (field programmable array FPGA). Microcontroller 64 and/or FPGA 64 is/are connected to a third frequency divider 58 via a serial or parallel databus 62. Microcontroller 64 and/or FPGA 64 is/are supplied with a first clock signal 66 by a clock generator 68. A second clock signal 70 is sent by clock generator 68 to reference signal input 18 of master module 12. A reference signal 20 for reference signal inputs 18 of slave modules 14 is supplied via reference signal line 72 from loop output 76 of a second frequency divider 54 of master module 12 via a module terminal 77. Loop input 22 of each slave module 14 is connectable to a loop output 76 of second frequency divider 54 of same particular slave module 14, namely internally within the module or looped via module terminals 77, 22.

Figure 3:
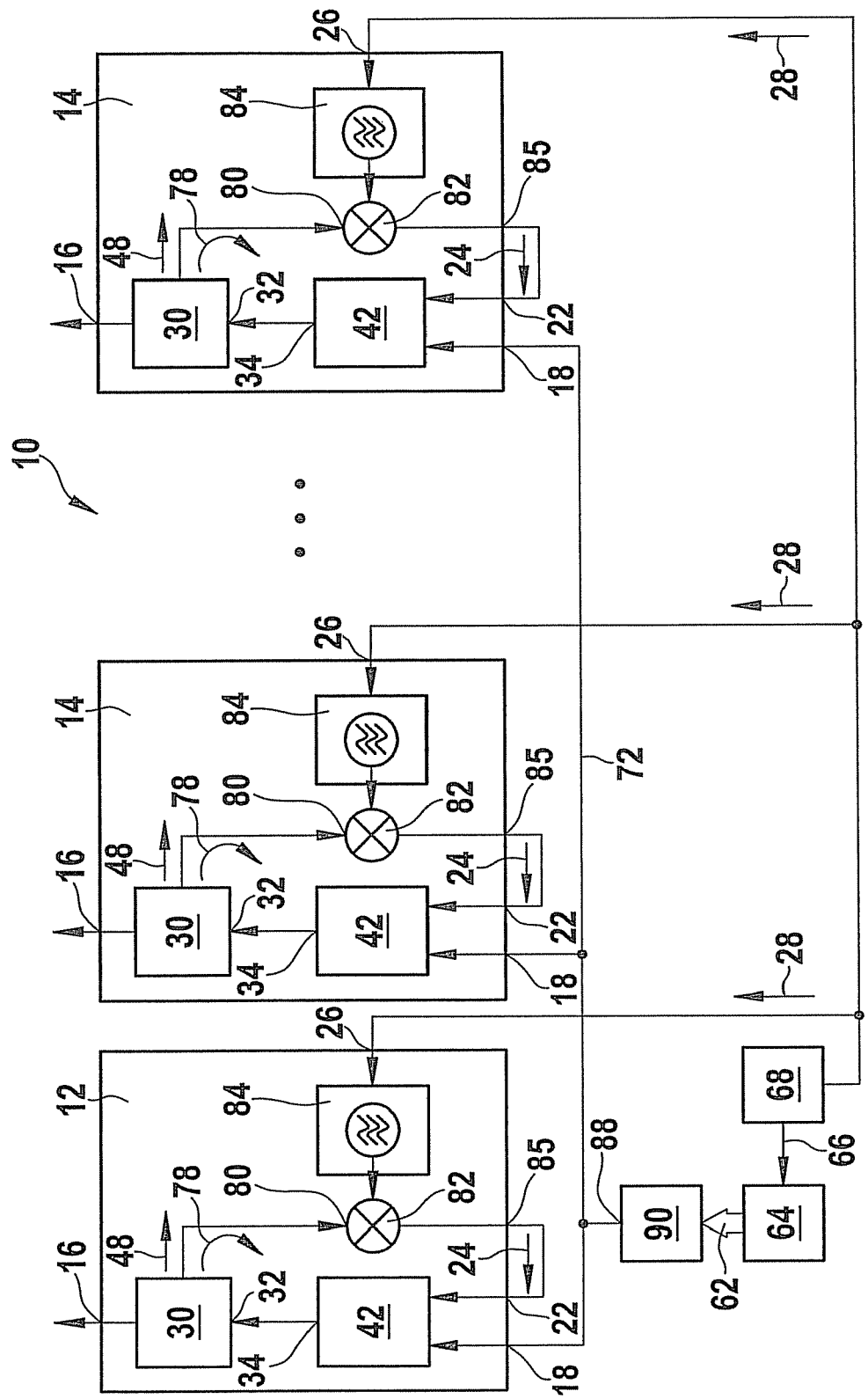
FIG. 3 shows a schematic block diagram of a second specific embodiment of the radar system according to the present invention.

FIG. 3 shows a schematic block diagram of a second specific embodiment of radar system 10 according to the present invention. Radar system 10 includes multiple identically designed modules 12, 14 (radar system modules; high-frequency modules). Each module 12, 14 has an output terminal 16 for a transmission antenna, an input terminal 18 for a reference signal 20 and an input terminal 22 for a first loop signal 24. Each module 12, 14 has an input 26 for a central clock signal 28. Each module 12, 14 includes a first high-frequency source 30 and a frequency control component 42, whose cooperation and particular design were described above. Output amplifier 40 outputs the amplified high-frequency transmission signal to antenna output 16. A second loop signal 48 from an output 45 of first frequency divider 46 is sent to a first input 80 of a mixer 82. A second high-frequency source 84 is connected to mixer 82, second high-frequency sources 84 of modules 12, 14 being synchronized by a shared clock pulse signal 28 from a clock generator 68 of radar system 10. A mixed product of mixer 82 of particular module 12, 14 is sent to loop input 22 of same module 12, 14, namely internally within the module or looped via module terminals 85, 22. Loop input 22 of module 12, 14 is connected to a loop input of frequency control component 42.

Reference signal 20 for reference signal inputs 18 of master module 12 and slave module 14 is supplied via a reference signal line 72 from a modulator output 88 of a modulator 90 (modulation module). Modulation of modulator 90 is adjustable via a microcontroller 64 or via a programmable integrated circuit 64 (field programmable array, FPGA). Microcontroller 64 or FPGA 64 is connected to modulator 90 via a serial or parallel databus 62. Microcontroller, i.e., FPGA 64 and/or modulator 90, is supplied with a first clock signal 66 from clock generator 68. Modulator 90 supplies a frequency-modulated or constant reference frequency. This reference frequency is usually within a range between 10 MHz and 3 GHz and is usually sent to modules 12, 14 via an HF strip conductor on a substrate. Identical modules 12, 14 provide a phase-locked step-up of the reference frequency to the transmission frequency. The step-up of the reference frequency occurs via an offset phase-locked loop 78, which includes a dielectric resonator 84 (dielectric resonator oscillator, DRO).

Figure 4:
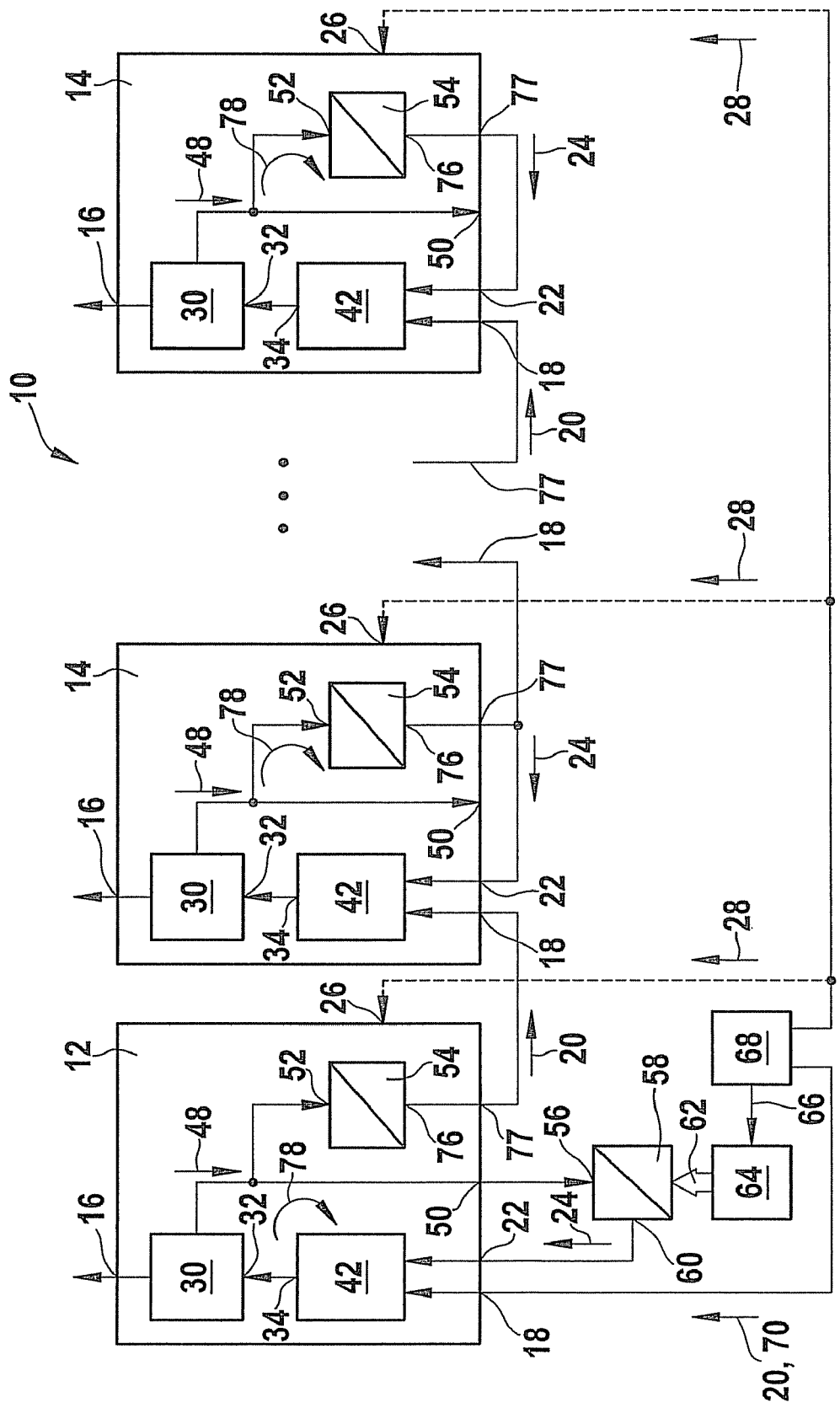
FIG. 4 shows a schematic block diagram of a third specific embodiment of the radar system according to the present invention.

FIG. 4 shows a schematic block diagram of a third specific embodiment of radar system 10 according to the present invention. Radar system 10 includes multiple identically designed modules 12, 14 (radar system modules). Each module 12, 14 has an output terminal 16 for a transmission antenna, an input terminal 18 for a reference signal 20, and an input terminal 22 for a first loop signal 24. Each module 12, 14 optionally has an input 26 for a central clock signal 28. Each module 12, 14 includes a first high-frequency source 30 and a frequency control component 42, whose cooperation and particular designs were described above. Output amplifier 40 outputs the amplified high-frequency transmission signal to antenna output 16. A second loop signal 48 from an output 45 of first frequency divider 46 is sent to a loop output 50 of module 12, 14 and to a first input 52 of a second frequency divider 54. Reference signal input 18 of a downstream slave module 14 is connected to output 76 of second frequency divider 54 inasmuch as it is not the last of the chain of downstream modules 12, 14. There is only one slave module 14 in the degenerate case. First module 12 of the chain of modules 12, 14 is a master module 12. In all slave modules 14, one output 76 of second frequency divider 54 is connected to a loop input 22 of same module 14, namely internally within the module or looped via module terminals 77, 22. Loop input 22 of module 12, 14 is connected to a loop input of frequency control component 42. A first output 60 of third frequency divider 58 is connected to loop input 22 of master module 12.

A division ratio of third frequency divider 58 is adjustable via a microcontroller 64 or via an FPGA 64. Microcontroller 64 or FPGA 64 is connected by a serial or parallel databus 62 to third frequency divider 58. Microcontroller 64 is supplied with a first clock signal 66 from a clock generator 68. A second clock signal 70 is sent from clock generator 68 to a reference signal input 18 of master module 12. Loop input 22 of each slave module 14 is connected to loop output 76 of second frequency divider 54 of same particular slave module 14, namely internally within the module or looped via module terminals 77, 22.

The signal is thus distributed to slave modules 14 either by a (modulated) master module 12 (as shown in FIG. 3) or, depending on the modulation and phase requirements, distributed by an internal second frequency divider 54 or an external third frequency divider 58, each preferably being programmable. A frequency (regulating intermediate frequency) divided down by frequency divider 54, 58 is sent to additional modules 14 in cascaded or parallel distribution. FIGS. 1 and 4 show specific embodiments in which the step-up of regulating intermediate frequency in downstream coupled modules 14 is accomplished via a phase-locked loop 78 in which the modulation is performed by an external programmable third frequency divider 58. FIG. 3 shows a specific embodiment having an offset phase-locked loop 78. In all specific embodiments, particular power amplifier 40 is preferably integrated into the particular module.

What is claimed is:
1. A radar system, comprising:
   at least two modules, each of the at least two modules having a phase detector, a first high-frequency source, and at least one of (a) one antenna output and (b) at least one antenna; and
   a device for synchronization between the first high-frequency source of a first module of the at least two modules and the first high-frequency source of a second module of the at least two modules;
   wherein the phase detector of each of the at least two modules has a first input for a first reference signal a second input for a first loop signal.

2. The radar system according to claim 1, wherein the first loop signal is of a phase-locked loop.

3. The radar system according to claim 2, wherein each of the at least two modules have a second high-frequency source and a mixer having a first input for a second loop signal of the phase-locked loop, an output of the second high-frequency source being connected to a second input of the mixer in each of the at least two modules.

4. The radar system according to claim 3, wherein the second high-frequency source has an input for a second reference signal.

5. The radar system according to claim 1, further comprising:
a bus terminal for controlling at least one of (a) the at least two modules, (b) a charge pump, (c) a filter, (d) a first frequency divider, (e) a frequency multiplier and (f) a high-frequency power amplifier.

6. The radar system according to claim 5, further comprising:
a device for supplying a synchronization signal for at least one downstream module.

7. The radar system according to claim 6, further comprising:
a second frequency divider for supplying the synchronization signal.

8. The radar system according to claim 1, wherein each of the at least two modules include a reception converter.

9. The radar system according to claim 1, wherein each of the at least two modules of the radar system are activated or deactivated in a targeted manner.

10. The radar system according to claim 1, wherein each of the at least two modules of the radar system have an identical design.

11. A module for a radar system, comprising:
a phase detector having a first input for a first reference signal and a second input for a first loop signal;
a first high-frequency source; and
at least one of (a) one antenna output and (b) at least one antenna.

12. The module according to claim 11, wherein the first loop signal is of a phase-locked loop.

* * * * *